(12) United States Patent
Wilcoxon et al.

(10) Patent No.: US 11,637,211 B2
(45) Date of Patent: Apr. 25, 2023

(54) OPTICALLY CLEAR THERMAL SPREADER FOR STATUS INDICATION WITHIN AN ELECTRONICS PACKAGE

(71) Applicant: Rockwell Collins, Inc., Cedar Rapids, IA (US)

(72) Inventors: Ross K. Wilcoxon, Cedar Rapids, IA (US); Reginald D. Bean, Center Point, IA (US); Russell C. Tawney, Cedar Rapids, IA (US); Bret W. Simon, West Liberty, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 132 days.

(21) Appl. No.: 17/165,176

(22) Filed: Feb. 2, 2021

(65) Prior Publication Data
US 2022/0246772 A1 Aug. 4, 2022

(51) Int. Cl.
*H01L 23/34* (2006.01)
*H05K 7/20* (2006.01)
(Continued)

(52) U.S. Cl.
CPC ............ *H01L 31/024* (2013.01); *H01L 23/34* (2013.01); *H01L 31/0203* (2013.01); *H01L 31/173* (2013.01); *H05K 7/20509* (2013.01)

(58) Field of Classification Search
CPC . H01L 31/024; H01L 31/0203; H01L 31/173; H01L 23/34; H01L 2223/54433;
(Continued)

(56) References Cited

U.S. PATENT DOCUMENTS 7,781,788 B2 8/2010 Darbinian et al.
8,076,693 B2 12/2011 Shi
(Continued)

FOREIGN PATENT DOCUMENTS

JP 4758780 B2 8/2011
TW 486143 U 5/2002
(Continued)

OTHER PUBLICATIONS

Extended Search Report in European Application No. 22154815.9 dated Jul. 1, 2022, 11 pages.

*Primary Examiner* — Stephen S Sul
(74) *Attorney, Agent, or Firm* — Suiter Swantz pc llo

(57) ABSTRACT

A system is disclosed that includes an electronic package. The electronic package includes a package base couplable to a host substrate, and a package lid mechanically coupled to the package base that includes one or more transparent lid areas, configured to permit transmission of light. The electronic package further includes a thermal spreader bonded on a first side to a first side of the package lid. The thermal spreader includes one or more transparent spreader areas that are configured to allow transmission of light through the thermal spreader. The electronic package further includes one or more integrated circuits bonded to a second side of the thermal spreader that communicatively coupled to the host substrate. The electronic package further includes one or more optical paths that include at least one of the one or more transparent spreader areas configured adjacent to at least one of the transparent lid areas.

11 Claims, 9 Drawing Sheets

(51) Int. Cl.
*H01L 31/024* (2014.01)
*H01L 31/0203* (2014.01)
*H01L 31/173* (2006.01)

(58) Field of Classification Search
CPC .. H01L 23/544; H05K 7/20509; H05K 7/205; H05K 2201/10106
See application file for complete search history.

(56) References Cited

U.S. PATENT DOCUMENTS

| | | | | |
|---|---|---|---|---|
| 8,090,228 | B2* | 1/2012 | Nobuhara | G02B 6/4232 |
| | | | | 385/76 |
| 9,831,395 | B2 | 11/2017 | Kim et al. | |
| 9,842,969 | B2 | 12/2017 | Hsieh | |
| 10,575,374 | B2* | 2/2020 | Yan | H01L 25/0753 |
| 10,811,331 | B2* | 10/2020 | Xia | H01L 23/10 |
| 11,002,926 | B1* | 5/2021 | Mathai | G02B 6/4284 |
| 11,061,193 | B2* | 7/2021 | Lee | G02B 6/4206 |
| 2003/0223697 | A1* | 12/2003 | Simon | H01L 23/36 |
| | | | | 257/E23.101 |
| 2004/0188124 | A1 | 9/2004 | Stark | |
| 2006/0071152 | A1 | 4/2006 | Ono | |
| 2006/0283961 | A1 | 12/2006 | Misawa et al. | |
| 2008/0013959 | A1* | 1/2008 | Ishigami | G02B 6/4204 |
| | | | | 398/135 |
| 2008/0150065 | A1* | 6/2008 | Oda | H01L 31/0203 |
| | | | | 257/E31.118 |
| 2010/0012828 | A1* | 1/2010 | Prejean | G12B 13/00 |
| | | | | 250/252.1 |
| 2011/0024610 | A1 | 2/2011 | Tu et al. | |
| 2011/0121841 | A1 | 5/2011 | Chen | |
| 2012/0094442 | A1* | 4/2012 | Lin | H05K 1/021 |
| | | | | 438/118 |
| 2013/0050227 | A1* | 2/2013 | Petersen | H01L 23/057 |
| | | | | 257/66 |
| 2013/0056863 | A1* | 3/2013 | Chi | H01L 24/73 |
| | | | | 438/126 |
| 2013/0248887 | A1* | 9/2013 | Coffy | G01S 17/04 |
| | | | | 438/25 |
| 2014/0041214 | A1* | 2/2014 | Barlow | H01L 27/14625 |
| | | | | 29/841 |
| 2014/0212085 | A1* | 7/2014 | Margaritis | H01L 24/11 |
| | | | | 385/14 |
| 2017/0083745 | A1* | 3/2017 | Goodelle | G06V 40/1318 |
| 2017/0160501 | A1* | 6/2017 | Schultz | G02B 6/4245 |
| 2017/0214475 | A1* | 7/2017 | Venter | H01L 31/125 |
| 2018/0314016 | A1* | 11/2018 | Fish | G02B 6/136 |
| 2019/0293923 | A1* | 9/2019 | Ghahremani | B81B 7/0067 |
| 2019/0317287 | A1* | 10/2019 | Raghunathan | G02B 6/4274 |
| 2020/0235034 | A1 | 7/2020 | Wu et al. | |
| 2020/0303322 | A1* | 9/2020 | Sakuma | H01L 23/58 |
| 2020/0343695 | A1* | 10/2020 | Mathai | H01L 24/16 |
| 2020/0402884 | A1* | 12/2020 | Wan | H01L 23/04 |
| 2021/0013116 | A1* | 1/2021 | Koduri | B81C 1/00317 |
| 2021/0165085 | A1* | 6/2021 | Downing | G01S 7/497 |
| 2021/0271020 | A1* | 9/2021 | Islam | H01L 25/105 |
| 2021/0302654 | A1* | 9/2021 | Chen | H01L 21/56 |
| 2022/0042672 | A1* | 2/2022 | Raring | F21V 9/38 |
| 2022/0155539 | A1* | 5/2022 | Pietambaram | G02B 6/4214 |
| 2022/0157691 | A1* | 5/2022 | Sharfi | H01L 23/3732 |
| 2022/0189788 | A1* | 6/2022 | Luan | H01S 5/02345 |
| 2022/0238411 | A1* | 7/2022 | Eid | H01L 23/3121 |

FOREIGN PATENT DOCUMENTS

| | | |
|---|---|---|
| TW | 265609 B | 11/2006 |
| TW | 202029421 A | 8/2020 |

* cited by examiner

FIG. 2C

OPTICALLY CLEAR THERMAL SPREADER FOR STATUS INDICATION WITHIN AN ELECTRONICS PACKAGE

BACKGROUND

Integrated circuits are normally integrated into protective packages, often referred to as electronic packages, to allow easy handling and assembly onto host substrates such as printed circuit boards. The outside covering of an electronic package commonly consists of a hardened plastic that protects the semiconductor die containing the integrated circuit from external environments and mechanical stresses. Electronic packages may also include thermal spreaders that conduct heat generated by the integrated circuit during use. Electronic packages may be configured to encapsulate one semiconductor die, or a multitude of semiconductor dies, as in a system-in-package, While the integrated circuit is physically protected by the mechanics of the electronic package, the electronic package mechanics prevent the status of the integrated circuit from being known, such as the functionality of the integrated circuit, independent of integrated circuit electrical interfaces wired to an electrically accessible interface of the electronics package. For example, within an electronic package, an integrated circuit may include or be coupled to a light emitting diode (LED) that emits visible light when the integrated circuit is functioning properly. However, the visual cue would be blocked once the integrated circuit and LED are encapsulated by the electronic package, The ability of the mechanics of an electronic package to shroud an integrated circuit may also allow counterfeiters to pass on counterfeit, and possibly defective, integrated circuits to a customer by mimicking the mechanics the package while the enclosed integrated circuit is a counterfeit. For example, a counterfeit integrated circuit may be packaged within an electronic package having the same shape and/or markings as an electronic package housing a genuine integrated circuit. The consumer purchasing the electronic package may not be able to identify the integrated circuit as counterfeit, even after the electronic package has been assembled onto a printed circuit board. Therefore, it is desirable to provide a solution to the shortcomings stated above.

SUMMARY

A system is disclosed. In one or more embodiments, the system includes an electronic package. In one or more embodiments, the electronic package includes a package base couplable to a host substrate. In one or more embodiments, the electronic package includes a package lid mechanically coupled to the package base. In one or more embodiments, the package base includes one or more transparent areas, wherein the one or more transparent lid areas are configured to allow transmission of light through the package lid or within the package. In one or more embodiments, the electronic package includes a thermal spreader bonded on a first side to a first side of the package lid. In one or more embodiments, the thermal spreader includes one or more transparent spreader areas, wherein the one or more transparent spreader areas are configured to allow transmission of light through the thermal spreader. In one or more embodiments, the electronic package includes one or more integrated circuits bonded to a second side of the thermal spreader, wherein the one or more integrated circuits is communicatively coupled to the host substrate. In one or more embodiments, the electronic package includes one or more optical paths comprising at least one of the one or more transparent spreader areas configured adjacent to at least one of the one or more transparent lid areas.

In some embodiments of the system, the system further includes one or more light sources disposed within the electronic package and electrically coupled to at least one of the one or more integrated circuits, wherein the one or more light sources are configured to emit light, wherein the light is transmitted via one of the one or more optical paths.

In some embodiments of the system, the transmitted light is detectable outside of the electronic package.

In some embodiments of the system, the transmitted light is configured as a status signal that identifies one or more operational characteristics of the one or more integrated circuits.

In some embodiments of the system, the transmitted light is configured as a data signal.

In some embodiments of the system, the system further includes one or more light sensors disposed within the electronic package and electrically coupled to at least one of the one or more integrated circuits, wherein the one or more light sensors are configured to detect light, wherein the light is transmitted to the one or more sensors via one of the one or more optical paths.

In some embodiments of the system, the transmitted light is emitted from an external light emitter, therein the transmitted light is configured as a data signal.

In some embodiments of the system, the system further includes one or more light sources disposed within the electronic package and electrically coupled to at least one of the one or more integrated circuits, wherein the one or more light sources are configured to emit light, wherein the light is transmitted to a light detector as a data signal via one of the one or more optical paths.

In some embodiments of the system, the one or more transparent lid areas is configured to display an identification signal when light is emitted by the one or more light sources.

In some embodiments of the system, wherein the optical path comprises light transmissible materials that modify one or more characteristics of light transmitting through the optical path, wherein the modification is configured to uniquely identify the electronic package.

In some embodiments of the system, at least a portion of the thermal spreader comprises glass, quartz, sapphire, diamond, plastic, or silicone.

In some embodiments of the system, the one or more transparent spreader areas is optically coupled to at least one of the one or more light sources or the one or more light sensors via at least one of direct contact, an air gap, dispensed silicone, clear plastic, or a solid transparent material.

Another system is also disclosed. In one or more embodiments, the system includes an electronic package. In one or more embodiments, the electronic package includes a package base couplable to a host substrate. In one or more embodiments, the electronic package includes a package lid mechanically coupled to the package base. In one or more embodiments, the electronic package includes a thermal spreader bonded on a first side to a first side of the package lid. In one or more embodiments, the thermal spreader includes one or more transparent spreader areas, wherein the one or more transparent spreader areas are configured to allow transmission of light through the thermal spreader. In one or more embodiments, the electronic package includes one or more integrated circuits in contact with a second side of the thermal spreader, wherein the one or more integrated circuits is communicatively coupled to the host substrate. In one or more embodiments, the electronic package includes one or more optical paths comprising at least one of the one or more transparent spreader areas configured adjacent to at least one of the one or more transparent lid areas. In one or more embodiments, the electronic package includes one or more light sources disposed within the electronic package and electrically coupled to at least one of the one or more integrated circuits, wherein the one or more light sources are configured to emit light, wherein the light is transmitted via one of the one or more optical paths. In one or more embodiments, the electronic package includes one or more light sensors disposed within the electronic package and electrically coupled to at least one of the one or more integrated circuits, wherein the one or more light sensors are configured to detect light from at least one of the one or more light sources, wherein the light is transmitted via one of the one or more optical paths.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

FIGS. 2A-E illustrate the system 90, including an electronic package 100 viewed as a cross-section, in accordance with one or more embodiments of this disclosure.

DETAILED DESCRIPTION

Figure 1:
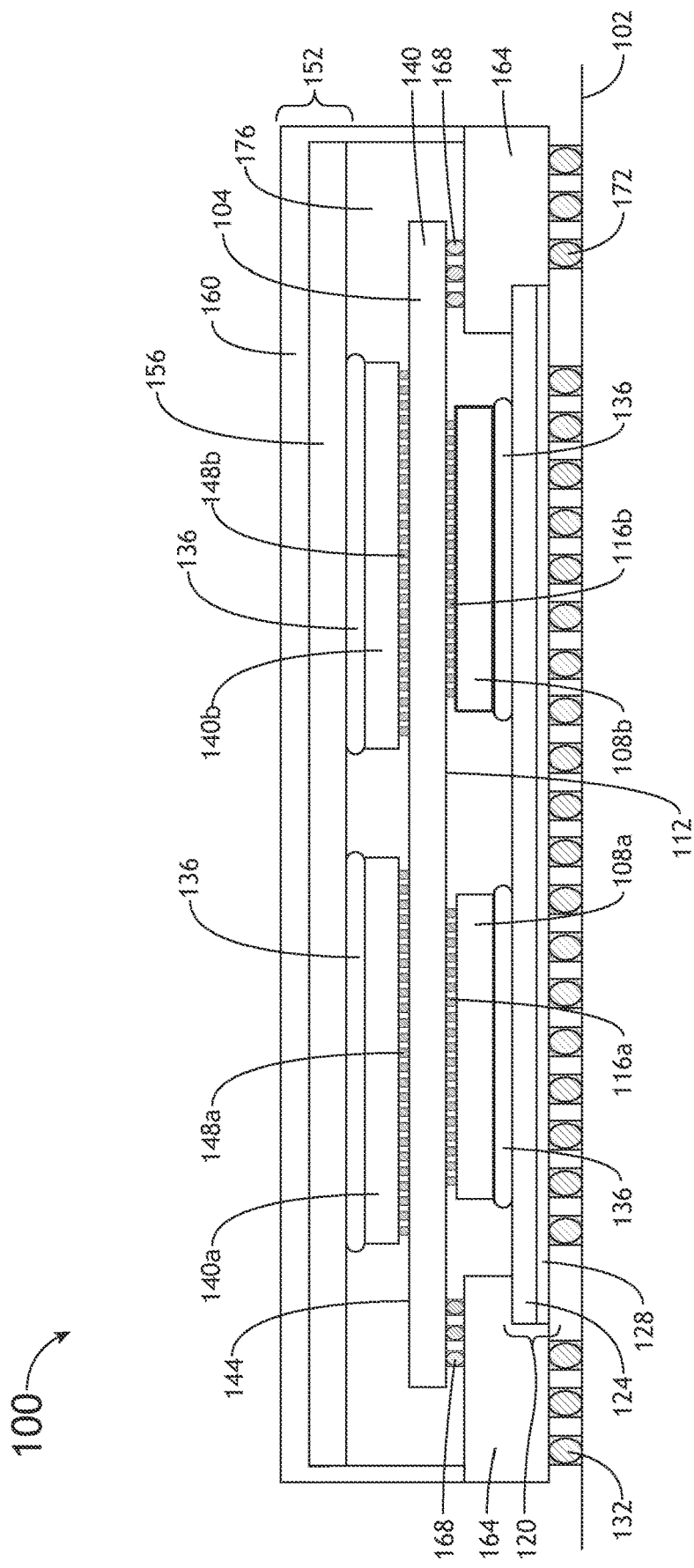
FIG. 1 illustrates a system 90, including an electronic package 100 viewed as a cross-section, in accordance with one or more embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

A system including an electronic package for an integrated circuit die is disclosed. In particular, an electronic package for an integrated circuit die is disclosed that includes a thermal spreader. The thermal spreader is at least partially transparent or has one or more transparent features or elements, with an optical path that allows light to travel through at least a portion of the thermal spreader. The electronic package may also include a package lid that also includes optical paths that line up with the one or more optical paths, features or elements of the thermal spreader. This arrangement may allow light to be transmitted from inside the electronic package (e.g., such as from an LED light source electrically coupled to the integrated circuit) to a light receiving mechanism outside of the electronic package (such as the human eye). This arrangement also allows light to be transmitted from outside the package to inside the electronic package, where it may be detected by a light sensor electrically coupled to the integrated circuit. The light transmitted through the optical path may be configured as a light signal that indicates integrated circuit status, integrated circuit identity, or any type of data transmission.

FIG. 1 illustrates a system 90, including an electronic package 100 viewed as a cross-section, in accordance with one or more embodiments of this disclosure. The electronic package 100 may comprise any type of integrated circuit packaging types including but not limited to through-hole packages, flip chip die, chip carriers, pin grid arrays, flat packages, small outline packages, chip-scale packages, and ball grid arrays (BGAs) For example, the electronic package 100 may comprise a BGA-type package, wherein bumps of solder are used to connect componentry of the electronic package 100 to a host substrate 102 (such as printed circuit boards (PCBs) or printed wiring boards (PWBs).

Electronic packages 100 that use area array packages comprise any array packaging known including but not limited to fine-pitch ball-grid array (FBGA), low-profile ball-grid array (LBGA), ceramic ball-grid array (CBGA), land grid array (LGA), and organic ball-grid array (OBGA). For example, the electronic package 100 may comprise a LBGA.

In some embodiments, the electronic package 100 includes a first interposer 104 providing an electrical interface between one or more components of the electronic package 100. The first interposer 104 may be constructed of any material known in the art. For example, the first interposer 104 may be constructed from a rigid glass-reinforced epoxy laminate material, such as FR-4. In another example, the first interposer may be constructed from flexible polyimide material. Interposers may take the form of any known componentry. For example, the first interposer 104 may comprise a high-density circuit board. The first interposer 104 may be of any size or area. For example, the first interposer 104 may have an area larger than a semiconductor chip. The electronic package 100 may also comprise multiple first interposers.

In some embodiments, the electronic package 100 comprises a first integrated circuit 108a, 108b (i.e., an integrated circuit formed upon a semiconductor die) electrically coupled and thermally coupled to a first side 112 of the first interposer 104. The first integrated circuit 108a, 108b may comprise any type of semiconductor chip including but not limited to a memory chip, a central processing unit (CPU), a graphical processing unit (GPU), an analog chip, an application-specific integrated circuit (ASIC), or a field programable gate array (FPGA). The first side 112 of the first interposer 104 may be coupled to any number and/or type of first integrated circuit 108a, 108b. For example, the first side 112 of the first interposer 104 may be coupled to two memory chips and an FPGA. The first integrated circuit 108a, 108b may be coupled to the first side 112 of the first interposer 104 via any method known including but not limited to bonding wires or solder bumps. For example, the first integrated circuit 108a, 108b may be coupled to the first side 112 of the first interposer 104 via a first solder ball array 116a, 116b (e.g., similar to flip chips.)

In some embodiments, the electronic package 100 includes one or more thermal spreaders providing an appropriate coefficient of thermal expansion (CTE) between elements within the electronic package 100 and providing structural support and physical protection against the ingress of potentially damaging materials such as moisture. For example, the electronic package 100 may comprise a base thermal spreader 120 coupled to the first integrated circuit 108a, 108b configured to conduct heat away from the first integrated circuit 108a, 108b to the host substrate 102 (i.e., transferring heat from the electronic package to the PCB). The base thermal spreader 120 may be composed of a single layer or composed of multiple layers. For example, the base thermal spreader 120 may comprise a base thermal layer 124 and a package base 128. The base thermal spreader 120 may be thermally coupled to the host substrate 102 via any method known including but not limited to solder bumps, thermal adhesive, thermal tape, thermal grease, or solder or solder-like compounds. For example, the base thermal spreader 120 may be thermally coupled to a circuit board via base solder bumps 132. In another example, the base thermal spreader 120 may be thermally coupled to a circuit board via a thermal interface material such as grease. In some embodiments, the package base 128 may be designated as a separate entity from the base thermal spreader.

In some embodiments, the first integrated circuit 108a, 108b is coupled to the base thermal spreader 120 via a thermal interface 136, which provides a low thermal resistance contact between the first integrated circuit 108a, 108b and the base thermal spreader 120. The thermal interface 136 may comprise any material or substance known including but not limited to thermal paste, thermal adhesive, thermal gap filler, a thermally conductive pad, thermal tape, phase-change materials, or metal thermal interface materials. For example, the thermal interface 136 may comprise a silicone, thermally conductive pad.

In some embodiments, the electronic package 100 comprises a second integrated circuit 140a, 140b electrically coupled and thermally coupled to a second side 144 of the first interposer 104. The second integrated circuit 140a, 140b, may comprise any type of semiconductor chip including but not limited to a memory chip, a CPU, a GPU, an ASIC, or an FPGA. The second side 144 of the first interposer 104 may be coupled to any number or type of second integrated circuit 140a, 140b. For example, the second side 144 of the second interposer may be coupled to three ASICs and a CPU.

In some embodiments, the second integrated circuit 140a, 140b may be coupled to the second side 144 of the first interposer 104 via any method known including but not limited to bonding wires or solder bumps. For example, the second integrated circuit 140a, 140b, may be coupled to a second side 144 of the first interposer 104 via a second solder ball array 148a, 148b. The second integrated circuit 140a, 140b, as well as the first integrated circuit 104a, 104b, may be communicatively coupled to host substrate 102 circuitry via any electrical connector (e.g., wires, or solder).

In some embodiments, the electronic package 100 comprises a top thermal spreader 152 thermally coupled to the second integrated circuit 140a, 140b configured to conduct heat away from the second integrated circuit 140a, 140b. The top thermal spreader 152 may be composed of a single layer or composed of multiple layers. For example, the top thermal spreader 152 may comprise a top thermal layer 156 and a package lid 160. The package lid 160 may be configured as a housing that extends over the sides of the electronic package 100, with the top thermal layer 150 lining the inside surface of the package lid 160, or a portion of the inside surface of the package lid 160. In some embodiments, the package lid 160 is designated as a separate element from the top thermal spreader 152. The second integrated circuit 140a, 140b may be coupled to the top thermal spreader 152 via a thermal interface 136, similar to the first integrated circuit 108a, 108b coupled to the base thermal spreader 120 via the thermal interface 136.

In some embodiments, the package base 128 and/or the package lid 160 may comprise a composite assembly of two or more materials that exhibit thermal characteristics, expansion characteristics, electrical characteristics, optical characteristics, and/or structural characteristics that would not be otherwise achieve with a single material. This composite assembly may involve mechanical attachment of the two or more materials to each other.

The package base 128 and/or the package lid 160 may be comprised of materials that provide a thermal path between internal components of the electronic package 100 and the external components of the electronic package 100. The package base 128 and/or the package lid 160 may also be comprised of materials that reduce electromagnetic interactions between the internal components of the electronic package 100 and the external components of the electronic package 100 through electromagnetic shielding, and/or absorption or reflection of electromagnetic energy. The package base 128 and/or the top lid 160 may also be comprised of materials that reduce the level of external radiation that enters the electronic package 100 to prevent single-event effects, such as single-event upsets.

The electronic package 100 may also include other structural and/or electrical components. For example, in some embodiments, the electronic includes a ring carrier 164. The ring carrier 164 provides a physical support for the electronic package 100 and is configured to mechanically couple the electronic package 100 to the host substrate 102. The ring carrier 164 may also be configured to conduct heat from the electronic package 100 to the host substrate 102. The ring carrier 164 may also be electrically coupled to the host substrate 102 and other componentry of the electronic package 100. For example, the ring carrier 164 may relay electric input and output signals from the first integrated circuit 108*a*, 108*b* and/or the second integrated circuit 140*a*, 140*b* to the host substrate 102, while providing a direct thermal path for the second integrated circuit 140*a*, 140*b* (e.g., the ring carrier 164 is configured with internal wiring that can transmit input signals and output signals between the first interposer 104 and the host substrate 102). In another example, the ring carrier 164 may be electrically coupled to the first interposer 104 via interposer-coupling solder bumps 168. In another example, the ring carrier 164 may be electrically coupled to the host substrate 102 (i.e., coupled to circuitry disposed on the host substrate 102) via ring solder bumps 172. In another example, the ring carrier 164 may be electrically coupled to the first interposer 104 via wire bonds from the top surface of the ring carrier 164 to the top surface of the first interposer 104.

FIGS. 2A-E illustrates electronic packages 100 that include transparent or semi-transparent elements, in accordance with one or more embodiments of this disclosure. In some embodiments, one or more thermal spreaders (e.g., the top thermal spreader 152, as in FIG. 2A) include a transparent spreader area 204 configured to allow transmission of light through a portion of the one or more thermal spreader. For example, the top thermal spreader 152 may include a transparent spreader area 204 configured as an optical path 208 (i.e., an optical path being any pathway for the transmission of light that may include but is not limited to a transparent spreader area 204). For instance, the transparent spreader area 204 may be configured as an optical path 208 having two optical path interfaces 212: one optical path interface 212*a* disposed adjacent to one of the first integrated circuits 108*a*, and a second optical path interface 212*b* disposed adjacent to another one of the first integrated circuits 108*b* (e.g., as in FIG. 2A).

In interest of clarity, it should be understood that any elements disposed on or within the top thermal spreader 152 may also in kind be disposed on or within the base thermal spreader 120 and vice-versa. It should also be understood that any elements disposed on or within the first integrated circuits 108*a*, 108*b*, may be also in kind be disposed on or within the second integrated circuits 140*a*, 140*b*, and vice-versa. Further, it should be understood that any elements disposed on or within the package base 128 may be disposed on or within the package lid 160, and vice-versa. Therefore, the description herein should not be interpreted as a limitation of the present disclosure, but merely an illustration.

The transparent spreader area 204 may configured to any size. For example, the transparent spreader area 204 may include the entirety of the top transparent spreader 152. In another example, the transparent spreader area 204 may be limited to a section that faces a section of one of the first integrated circuits 108*a*, 108*b*. The transparent spreader area 204 may be configured to any shape. For example, the transparent spreader area 204 may be configured as a tube-like optical path 208 (e.g., as in FIG. 2A). In another example, the transparent spreader area 204 may be configured as an open space facing one or more first integrated circuits 108*a*, 108*b*. The top thermal spreader 120 may include any number of transparent spreader areas 204. For example, the top thermal spreader 120 may include five transparent spreader areas 204, each configured as a tube-like optical path 208.

The transparent spreader area 204 may comprise any medium by which light may be transmitted. For example, the medium of the transparent spreader area 204 may comprise any transparent or semi-transparent solid (e.g., organic or inorganic) including but not limited to such as glass, quartz, sapphire, diamond, silicone, or plastic. For instance, the medium may comprise optical fibers containing glass (e.g., silica). In another example, the medium of the transparent spreader area 204 may comprise any transparent or semi-transparent liquid including but not limited to water, thermal grease, or processor coolant. For instance, the medium may comprise propylene glycol. In another example, the medium of the transparent spreader area 204 may comprise a transparent or semi-transparent gas. For example, the transparent spreader area 204 may comprise a void filled with nitrogen gas. In another example, the transparent spreader area 204 may comprise an empty space (i.e., a cavity under vacuum).

In some embodiments, the electronic package 100 may include one or more light sources 216 disposed within the electronic package 100 and electrically coupled to one or more of the first integrated circuits 108*a*, 108*b* (i.e., the one or more light sources 216 are instructed to emit light based on instructions received from the one or more first integrated circuits). The one or more light sources 216 may also be optically coupled to one or more transparent spreader areas 204. For example, the one or more light sources 216 may be optically coupled to one or more optical path interfaces 212 of the one or more optical paths. For instance, emitted light 220 from the one or more light sources 216 may enter the one or more transparent spreader areas 204 (i.e., configured as an optical path 208) via the optical path interface 212*a*.

The one or more light sources 216 may include any type of lighting technology including but not limited to light emitting diodes (LEDs), lasers, and light emitting integrated circuits (LEICs). For example, the one or more light sources 216 may be configured as a LED containing gallium nitride. The one or more light sources may be of any size of shape. For example, the one or more light sources 216 may be configured as having the shape of a small bulb that is coupled to one of the first integrated circuits 108*a* via a small wire. In another example, the one or more light source 216 may be configured as an integrated circuit element that is included within the first integrated circuit 108*a*.

The one or more light sources 216 may be configured to emit any type of light or light characteristic (e.g., wavelength, intensity, flash pattern,). For example, the one or more light sources 216 may be configured to emit light within the ultraviolet range (e.g., 10 nm to 400 nm). In another example, the one or more light sources 216 may be configured to emit light within the infrared range (e.g., 700 nm to 1000 nm). In another example, the one or more light sources 216 may be configured to emit light within the visible spectrum (e.g., 400 nm to 700 nm). For instance, the one or more light sources 216 may be configured to emit light within the range of 400 nm to 500 nm. In another instance, the one or more light sources 216 may be configured to emit light within the range of 500 nm to 600 nm. In another instance, the one or more light sources 216 may be configured to emit light within the range of 600 nm to 700 nm. The one or more light sources 216 may be configured to emit light from multiple wavelengths. including those wavelengths listed in ranges include above. For example, the one or more light sources may be configured to emit a red light (e.g., ~700 nm) or a green light (e.g., 550 nm). T In some embodiments, the electronic package 100 may include one or more light sensors 224 disposed within the electronic package 100 and electronically coupled to one of the first integrated circuits 108a, 108b (i.e., the one or more light sensors 224 are instructed to receive light which is integrated to an electrical signal based on receiver circuitry and instructions received from the one or more first integrated circuits). The one or more light sensors 224 may also be optically coupled to the one or more transparent spreader areas 204. For example, the one or more light sensors 224 may be optically coupled to one or more optical path interfaces 212 of the one or more optical paths. For instance, the one or more light sensors 224 may collect received light 228 from the one or more transparent spreader areas 204 (i.e., configured as an optical path 208) via the optical path interface 212b.

The one or more light sensors 224 may include any type of light sensing technology including but not limited to photo-emissive cells, photo-conductive cells, photo-voltaic cells, photo-junction devices, photoresistors, photodiodes, and phototransistors. For example, the one or more light sensors 224 may be configured as a photodiode coupled to one of the first integrated circuits 108b via a small wire. In another example, the one or more light sensors may be a photo-junction device that is included within the first integrated circuit 108b.

The one or more light sensors 224 may be configured to detect any type of light or light characteristic (e.g., wavelength, intensity, flash pattern,). For example, the one or more light sensors 224 may be configured to detect light within the ultraviolet range. (e.g., 10 nm to 400 nm). In another example, the one or more light sensors 224 may be configured to detect light within the infrared range (e.g., 700 nm to 1000 nm). In another example, the one or more light sensors 224 may be configured to detect light within the visible spectrum (e.g., 400 nm to 700 nm). For instance, the one or more light sources 216 may be configured to emit light within the range of 400 nm to 500 nm. In another instance, the one or more light sensors 224 may be configured to detect light within the range of 500 nm to 600 nm. In another instance, the one or more light sensors 224 may be configured to detect light within the range of 600 nm to 700 nm. The one or more light sensors 224 may be configured to detect light from multiple wavelengths. including those wavelengths listed within the ranges include above. The one or more light sensors 224 may also be configured to determine the type or wavelength of light that is received from the one or more transparent spreader areas 204. For example, the light sensor 224 may be configured to differentiate between a red light (e.g., ~700 nm) or a green light (e.g., 550 nm).

The optical coupling of the one or more light sources 216 and/or the one or more light sensors 224 to the transparent spreader areas 204 (e.g., via the one or more optical path interfaces 212a, 212b) may be fashioned via any method or substance known including but not limited to direct contact, an air gap, dispensed silicone, clear plastic, or any other transparent material. For example, the one or more light sources 216 may be configured as an LED that is essentially glued into a position immediate adjacent to the optical path interface 212a via a transparent silicone.

In some embodiments, the thermal interface 136 is transparent or semi-transparent. For example, in referring to FIG. 2B, the optical path 208 may include both a transparent spreader area 204 and the thermal interface, permitting the transmission of light across the optical path interfaces 212a, 212b. The light source 216 may be configured as an on-chip LED, emitting light that transmits through the thermal interface 136 and the transparent spreader area, via the optical path 208, then transmits again through the thermal interface 136 to the light sensor 224.

In some embodiments, the package lid 160 further includes one or more transparent lid areas 232 that allow transmission of light out of, or into, the electronic package 100. The one or more transparent lid areas 232 may be configured as any size, shape, number, or placement upon the package lid 160. For example, the one or more transparent lid areas 232 may be configured as pattern of small through holes arranged throughout the top surface of the package lid 160. In another example, the one or more transparent lid areas 232 may be configured as small slits one the corners or side portions of the 160. In another example, the one or more transparent lid areas may be a single large through hole located on one quadrant of the top lid.

As shown in FIG. 2C, one or more transparent lid areas 232 may be aligned with one or more transparent spreader areas 204, creating an optical path 208 that permits light emitted from the light source 216 to transmit outside of the electronic package 100. The light may then be detected visually (e.g., by the human eye) or by a light detector 236. The light detector 236 may be configured as an external light detector (e.g., from outside the package) or an internal light detector (e.g., from within the electronic package 100). Therefore, the description above should not be interpreted as a limitation of the present disclosure, but merely an illustration.

Figure 2A:
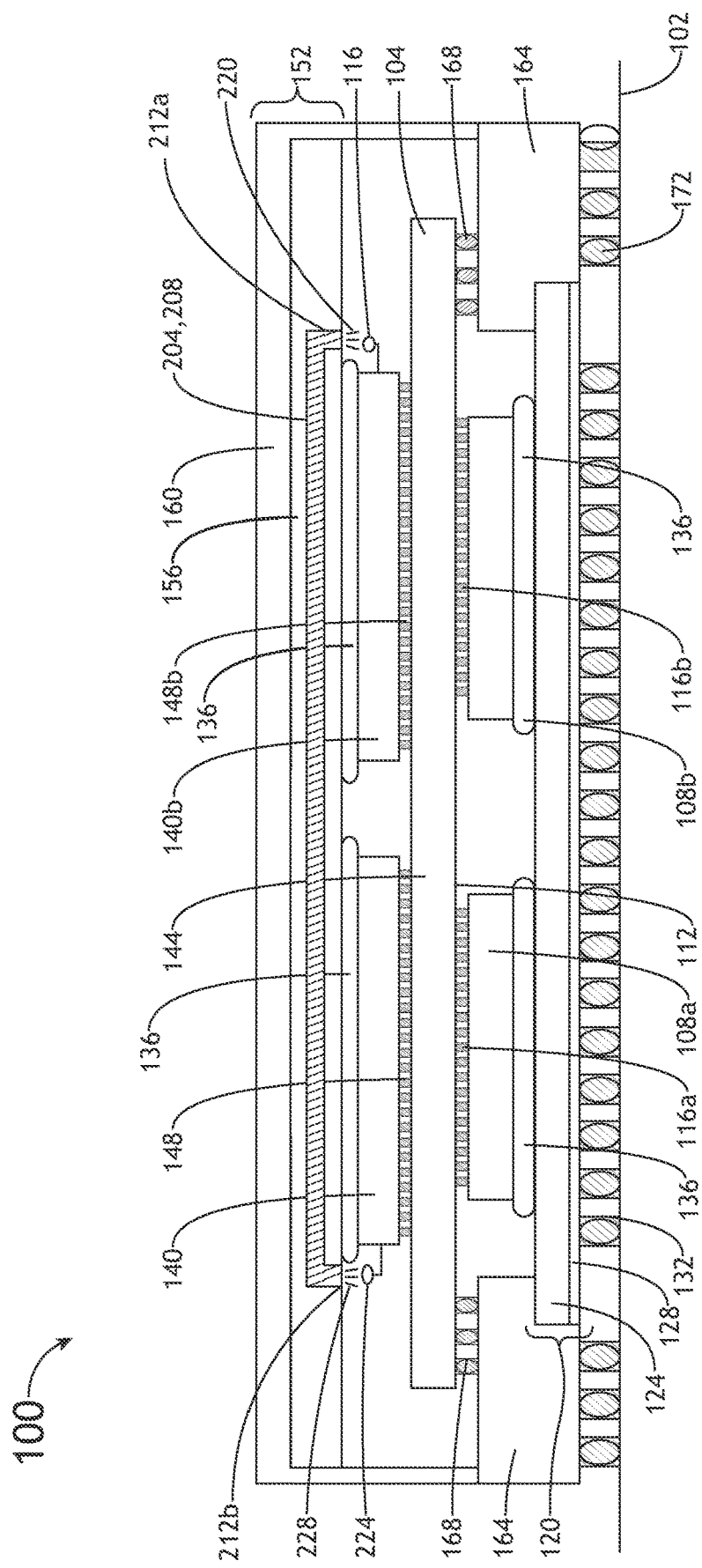
Figure 2B:
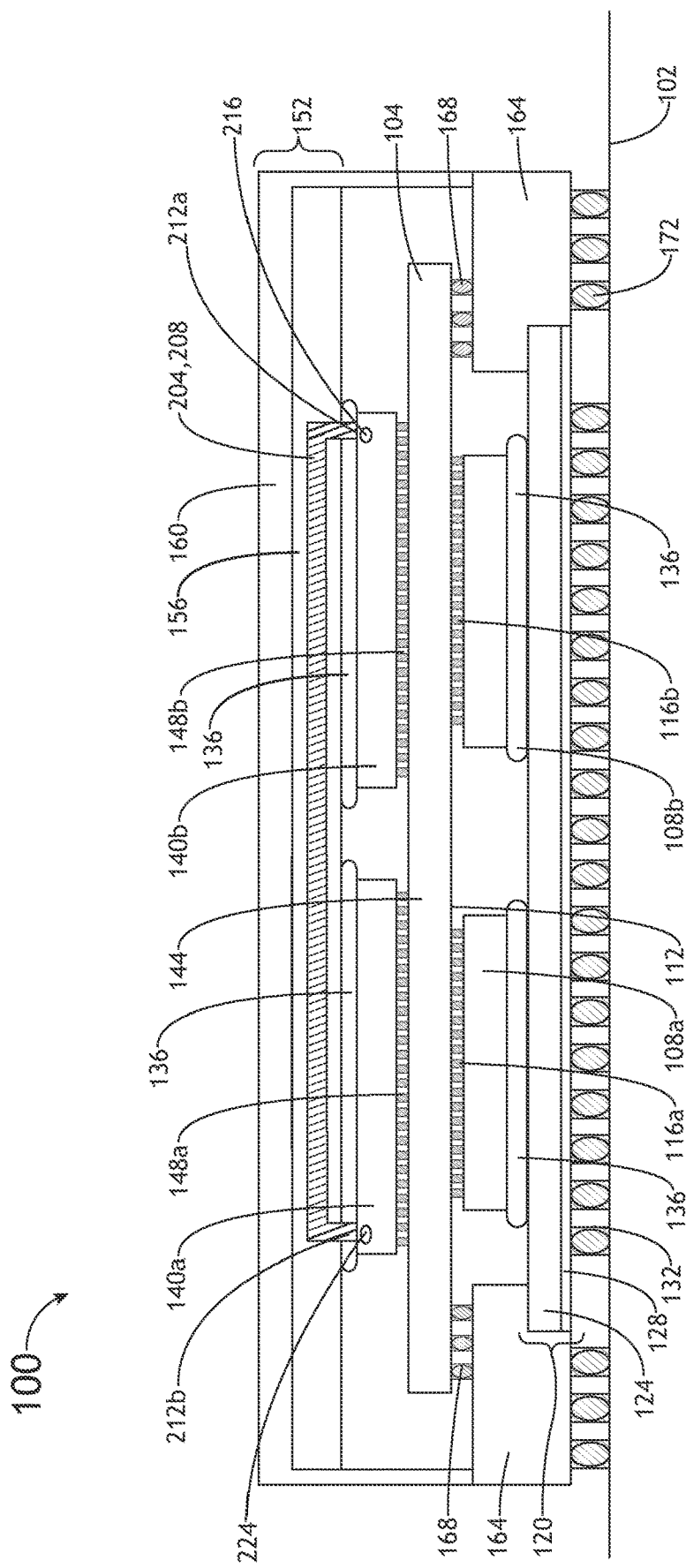
Figure 2C:
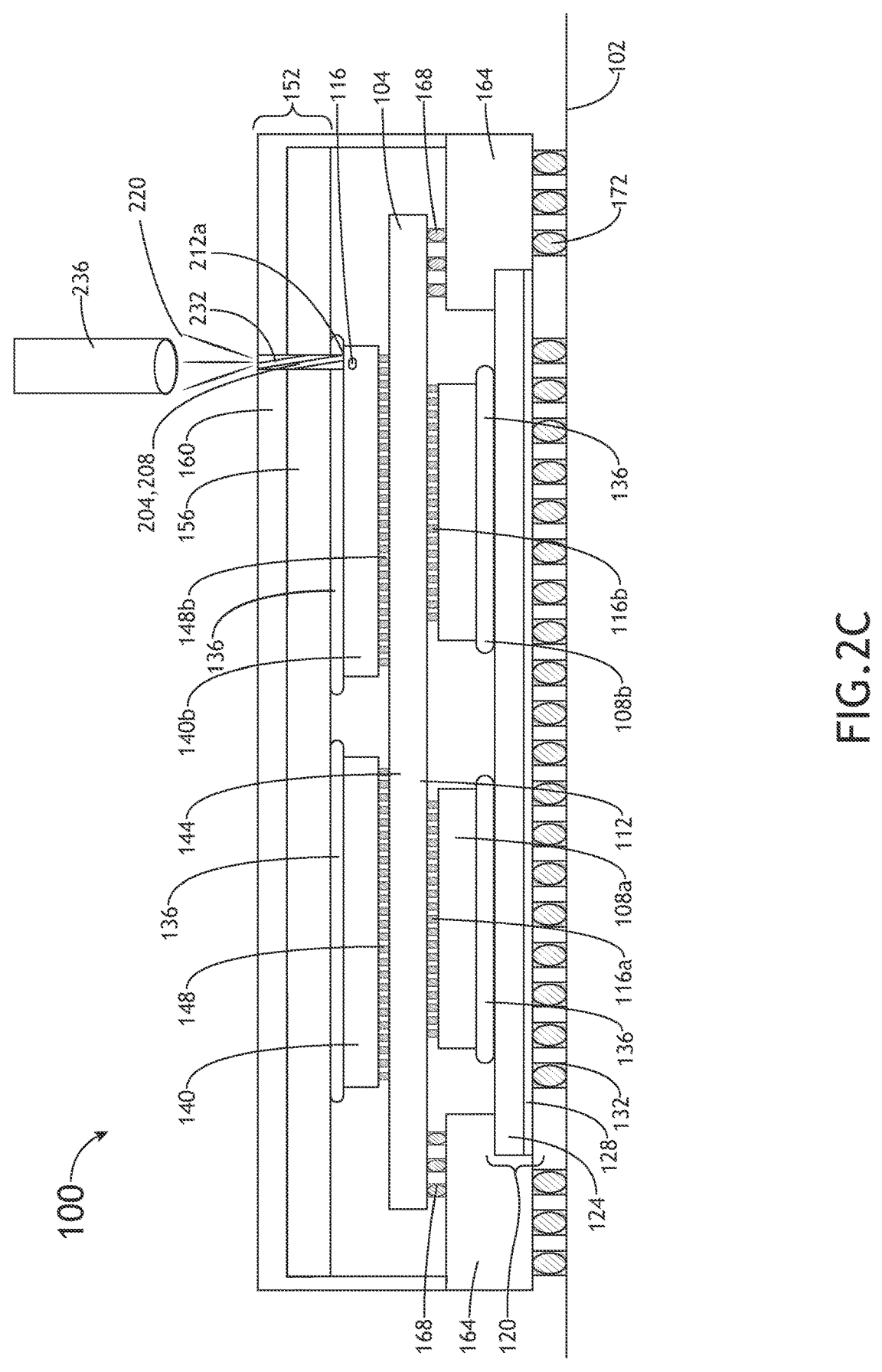
Figure 2D:
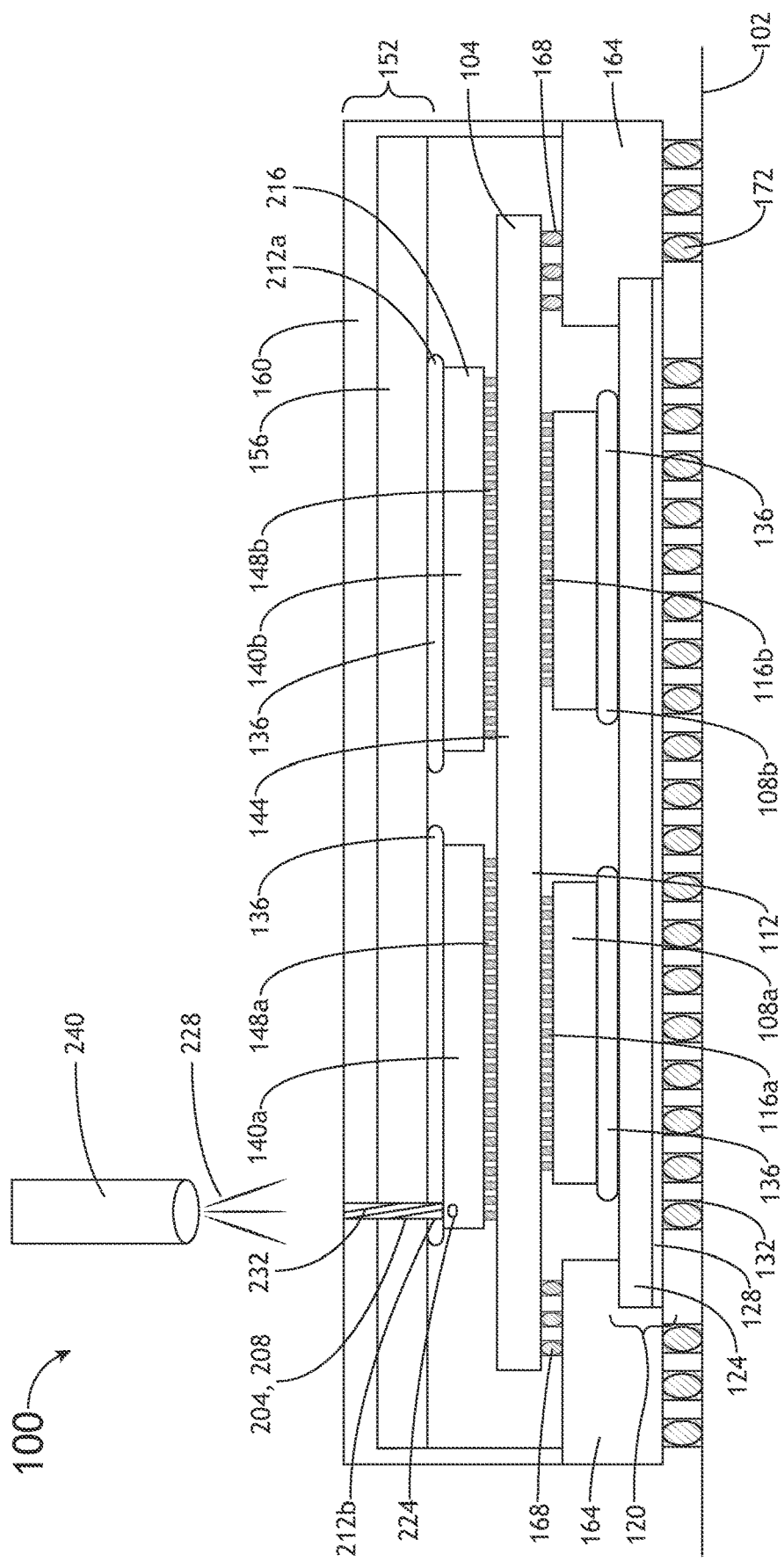

As shown in FIG. 2D, one or more transparent lid areas 232 may be aligned with one or more transparent spreader areas 204 to create an optical path 208 that permits light emitted from an external light emitter 240 to enter the electronic package, where it is detected by the one or more light sensors 224. The electronic package 100 may include both optical paths 208 that permit light from the one or more light sources to transmit outside of the electronic package 100 and optical paths 208 that permit light from an external light emitter 240 to be transmitted to the one or more light sensors 224 inside the electronics package.

In some embodiments, the transmitted light (e.g., the emitted light 220 shown in FIGS. 2A, 2C) is configured as a status signal. For example, the one or more light sources 216 electrically coupled to the one or more first integrated circuit 108a, 108b, may emit light (e.g., a green light), if the first integrated circuit 108a, 108b is operating at a normal status (i.e., the first integrated circuit 108a, 108b is functioning correctly, is active, or is online). In another example, the one or more light sources 216 electrically coupled to the one or more first integrated circuit 108a, 108b, may emit light (e.g., a red light), if the first integrated circuit 108a, 108b is operating at an impaired status (i.e., the first integrated circuit 108a, 108b is not functioning correctly, is not active, or is offline). In another example, the one or more light sources may emit a yellow light if the one of more functions within the first integrated circuits 108a, 108b are temporarily interrupted or paused. The transmitted light configured as a status signal may be detected by the light sensor 224 (e.g., as in FIG. 2A, B), the light detector 236 (e.g., as in FIG. 2C, E) or by the human eye. It should be known that any color (i.e., wavelength) light intensity, length of pulse, or pulse sequence may be used to communicate the status of the first integrated circuit 108a, 108b. Therefore, the description herein should not be interpreted as a limitation of the present disclosure, but merely an illustration.

In some embodiments, the transmitted light (e.g., the emitted light 220 and/or the received light 228) is configured as a data signal. The data signal may be configured to include any type of data and the optical transmission of the data signal may be configured to include any characteristic of light (e.g., wavelength, polarization, light intensity, length of pulse, or pulse sequence). The data signal may also be configured as any type of carrier wave or waveform. For example, the data signal may utilize modulation technologies (e.g., frequency modulation or amplitude modulation) For instance, the data signal may utilize frequency shift keying, frequency shift keying, and/or phase-shift keying. In another instance, the data signal may utilize binary pulse modulation (e.g., pulse amplitude (PAM), or pulse position modulation (PPM)). In another instance, the data signal may utilize m-ary pulse modulation (e.g., m-ary PAM or m-ary PPM).

In some embodiments, the data signal may be configured for a one-way optical communication. For example, the data signal may be transmitted to one or more light sensors 224 from the external light emitter 240 (e.g., as in FIG. 2E). In another example, the data signal may be transmitted to the light detector 236 from the one or more light sources 216.

Figure 2E:
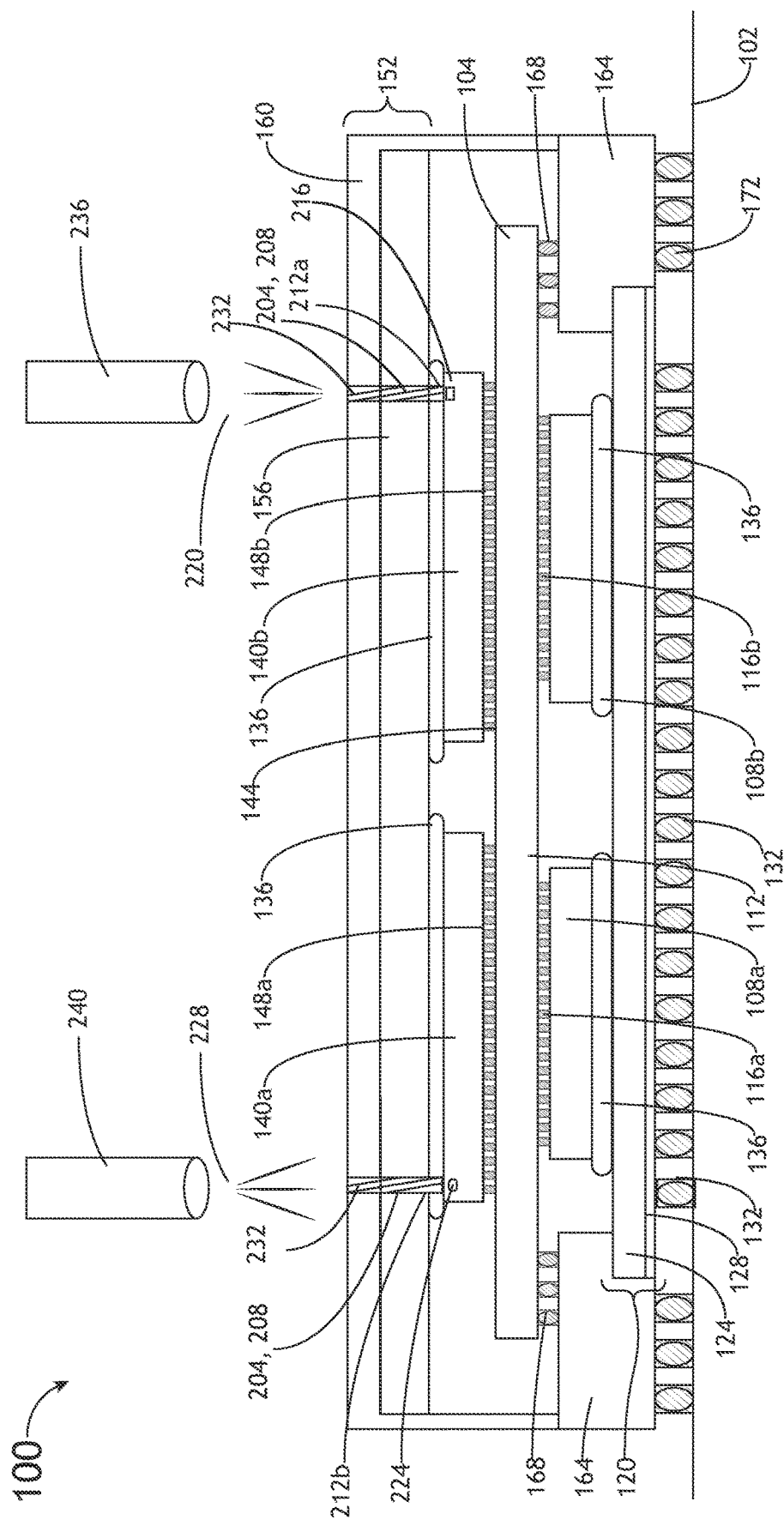

In some embodiments, the data signal may be configured for duplex communication. For example, the external light emitter 240 and the light detector 236 may be incorporated together as an optical transceiver (e.g., as shown in FIG. 2E), permitting coordinated communication with the one or more second integrated circuits 140a, 140b. In this fashion, the electronic package 100, or a device that includes the electronic package 100 could visually report its status to a user, who could in turn provide light-base instructions, via the external light emitter 240 on how to proceed given the status of the electronic package 100 or device.

Additionally, two or more transceivers formed from the combination of the one or more light sensors 224 and the one or more light sources 216 may themselves be able to communicate internally between one or more electronic elements within the electronic package. These duplex communication methods may be configured similarly to light fidelity (Li-Fi) communication systems.

In some embodiments, the transmitted light (e.g., the emitted light 220) is configured as an identification signal that identifies the first integrated circuit 108a, 108b. For example, the identification signal may identify the first integrated circuit 108a, 108b as a genuine integrated circuit. For instance, one or more light sources 216 of the first integrated circuit 108a, 108b may be configured to emit a specific light characteristic (e.g., wavelength, polarization, light intensity, length of pulse, or pulse sequence) automatically, or upon an input by a user. A predicted response by the one or more light sources 216 would then identify the one or more integrated circuits 108a, 108b as a genuine element of the electronic package 100. A non-predicted response by the one or more light sources 216 would result in an incorrect or counterfeit element within the electronic package 100.

Figure 3A:
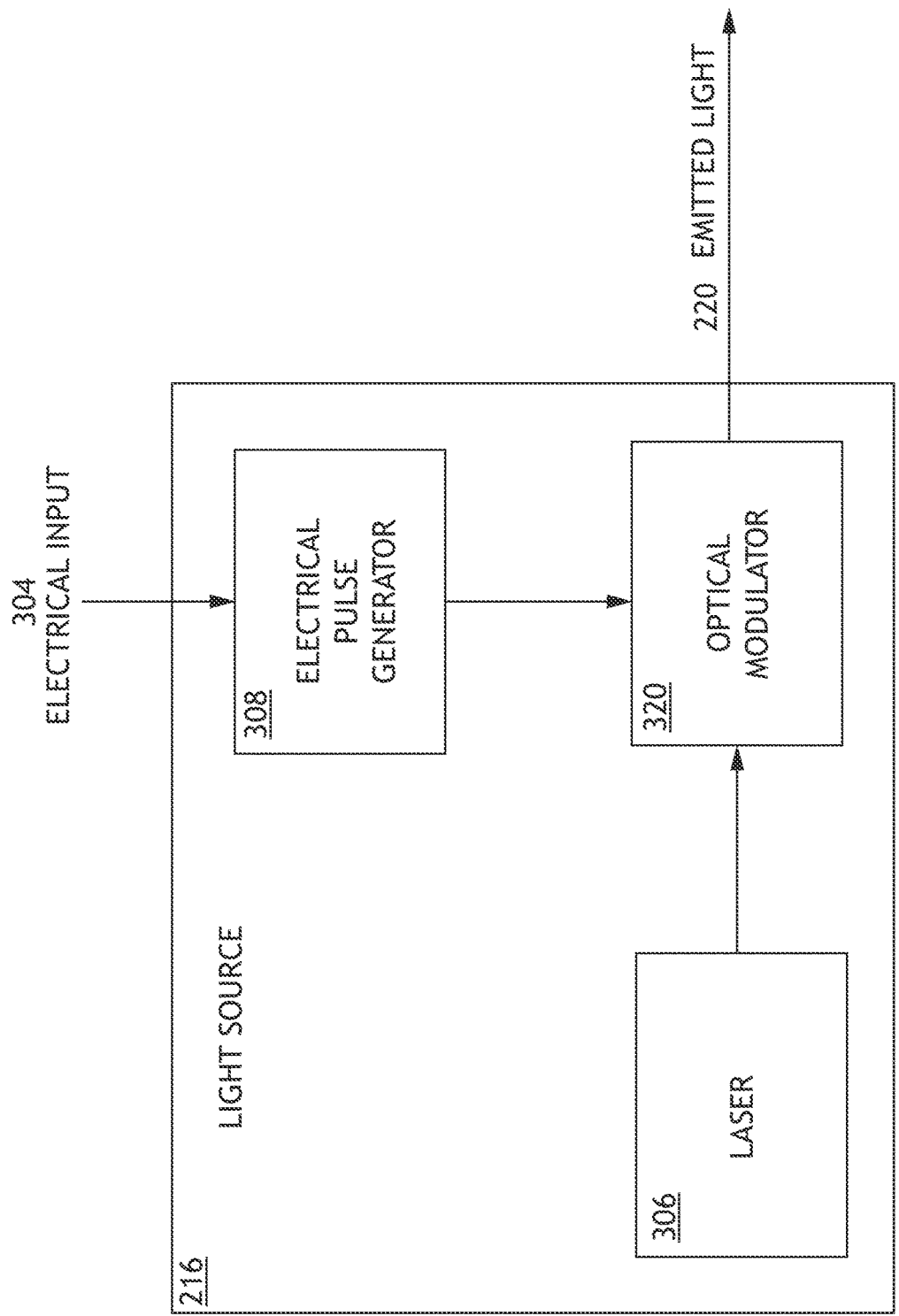
FIG. 3A is a block diagram illustrating one or more light sources configured as an optical transmitter for converting an electrical input from one or more first integrated circuits, into emitted light, in accordance with one or more embodiments of this disclosure.

In some embodiments, the one or more light sources 216 may be configured as an optical transmitter. FIG. 3A is a block diagram illustrating the one or more light sources 216 configured as an optical transmitter for converting an electrical input 304 from the one or more first integrated circuits 108a, 108b, into the emitted light 228, in accordance with one or more embodiments of this disclosure. The one or more light sources 216 may include a laser 306. The laser may be configured as any laser known in the art for generating communication light signals. The one or more light sources 216 may further include an electrical pulse generator 308 configured to generate electrical pulses based on the electrical input 304. The electrical pulse generator 308 may produce any pulse of any type of signal (e.g., modulate signal) as described herein). The one or more light sources may also include an optical modulator 312 configured to modulate light from the laser 306 based on input from the electrical pulse generator 308, resulting in an emitted light 220 that encodes data, status, and or identification.

Figure 3B:
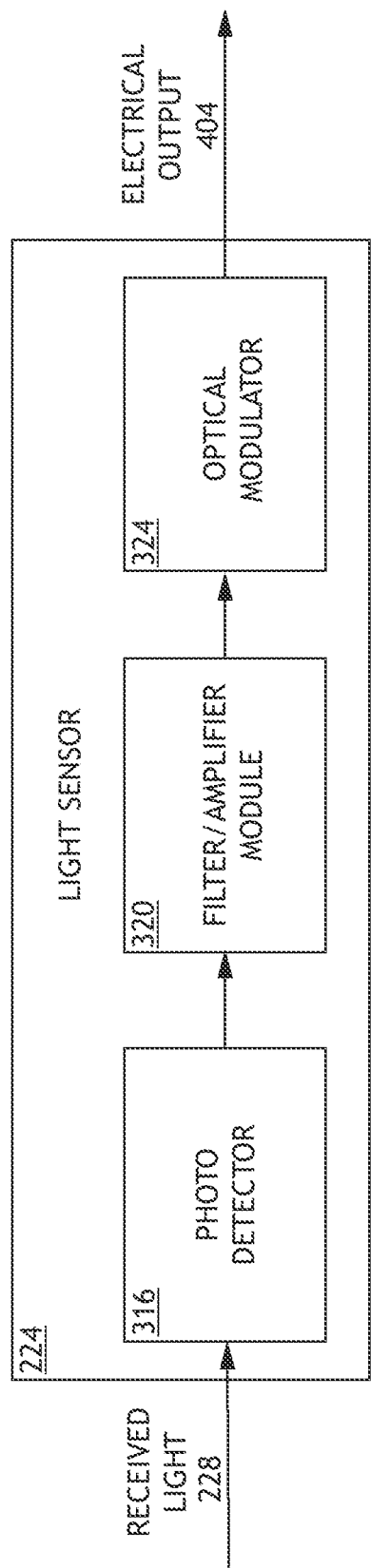
FIG. 3B is a block diagram illustrating one or more light sensors configured as an optical receiver for converting received light from one or more integrated circuit driven optical transmitters into an electrical output, in accordance with one or more embodiments of this disclosure.

In some embodiments, the one or more light sensors 224 may be configured as an optical receiver. FIG. 3B is a block diagram illustrating the one or more light sensors 224 configured as an optical receiver for converting received light 228 from the one or more light source 216 into the electrical output 404, in accordance with one or more embodiments of this disclosure. The one or more light sensors 224 may include a photodetector 316 configured to convert the incoming light to electrical pulses. The photodetector 316 may include any light detecting element described herein. The one or more light sensors 224 may further include a filter/amplifier module 320 configured to filter and/or amplify the incoming electrical pulses. The one or more light sensors 224 may further include an optical modulator 324 configured to demodulate the electrical pulses received from the filter/amplifier module 320, resulting in an electrical output that encodes data.

Figure 4:
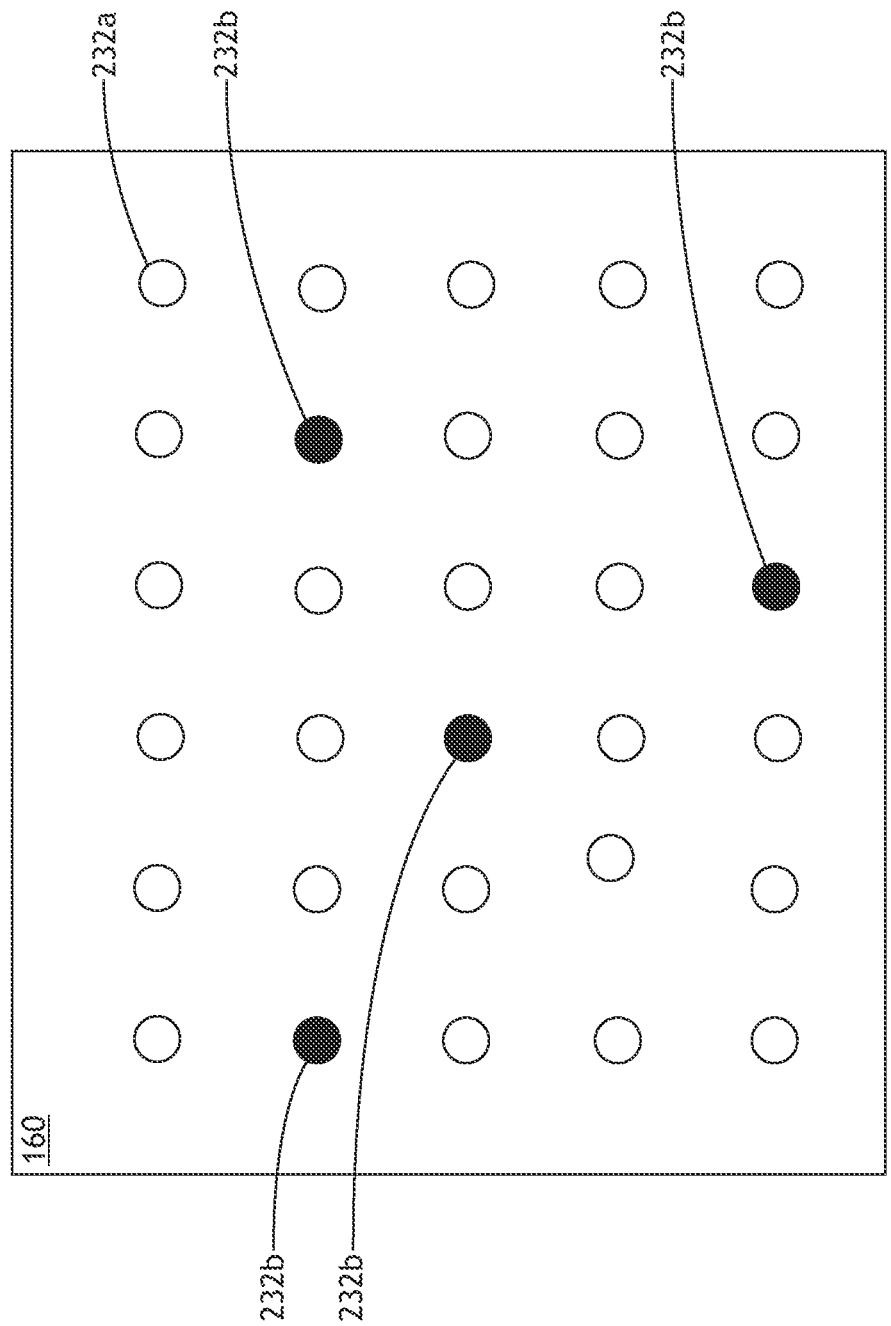
FIG. 4 is a diagram illustrating a top plan view of an electronic package presenting a package lid configured with a plurality of lid transparent areas, in accordance with one or more embodiments of this disclosure.

In some embodiments, the pattern of light emitting through the one or more lid transparent areas may be used to determine the identity of the electronic package 100 and or one or more of the first integrated circuits 108a, 108b (i.e., the pattern is a 'fingerprint' for the identity of the electronic package and/or first integrated circuits 108a, 108b). FIG. 4 is a diagram illustrating a top plan view of the electronic package 100 presenting the package lid 160 configured with a plurality of lid transparent areas 232, in accordance with one or more embodiments of this disclosure. The top lid 160 may have any arrangement of lid transparent areas 232 (e.g., such as the grid in FIG. 4) with one or more of the transparent areas optically coupled to the one or more light sources 216. Lid transparent areas 232 that are not optically coupled to an active light source 216 are represented by an empty circle (e.g., 232a in FIG. 4).

Upon activation or query of the one or more first integrated circuits 108a, 108b, one or more of the lid transparent areas 232 may emit light from the one or more light sources (e.g., 232b in FIG. 4). This pattern or fingerprint may be visually determined by a user as uniquely identifying the electronic package 100 and/or first integrated circuit 108a, 108*b*. This pattern or fingerprint may also confirm that the electronic package 100 and/or integrated circuit 108*a*, 108*b* is not counterfeit. For example, the fingerprint may be compared to data provided by the manufacturer to verify authenticity.

In some embodiments, at least one of the one or more lid transparent areas 232 has one or more optical properties that alters the transmittance of light (e.g., altering wavelength, polarization, light intensity, and/or phase) allowing an identification of the electronic package 100 or one of the first integrated circuits 108*a*, 108*b*. The production of the one or more lid transparent areas 232 having one or more transmission altering properties may involve any number of methods and/or substances including but not limited to dispersion (e.g., random dispersion) of composite optical material (e.g., a matrix of materials) with non-uniform properties, depositing multiple layers of materials, additive manufacturing, and utilizing localized manufacturing defects or manufacturing variations.

In some embodiments, the pattern, fingerprint, and/or one or more optical properties of the one or more lid transparent areas 232 provide a unique and identifiable aspect of the electronic package, whether or not there are one or more light sources 216. For example, the pattern of one or more lid transparent areas 232 (e.g., as in FIG. 4) may be detectable to the naked eye regardless of any light source 216 and be identifying as a specific type or brand of electronic package 100. This physical pattern or fingerprint would require considerably more effort to be reproduced by a counterfeiter, and may reduce efforts by the counterfeiter to create knock-offs or duplicates of the electronic package 100.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A system comprising:
   an electronic package comprising:
      a package base couplable to a host substrate;
      a package lid mechanically coupled to the package base comprising one or more transparent lid areas, wherein the one or more transparent lid areas are configured to allow transmission of light through the package lid;
      a thermal spreader bonded on a first side to a first side of the package lid, comprising one or more transparent spreader areas, wherein the one or more transparent spreader areas are configured to allow transmission of the light through the thermal spreader;
      one or more integrated circuits bonded to a second side of the thermal spreader, wherein the one or more integrated circuits is communicatively coupled to the host substrate;
      optical paths comprising at least one of the one or more transparent spreader areas configured adjacent to at least one of the one or more transparent lid areas; and
      one or more light sources disposed within the electronic package and electrically coupled to at least one of the one or more integrated circuits,
      wherein the one or more transparent lid areas are arranged in a grid,
      wherein the one or more light sources are coupled to a portion of the one or more transparent lid areas, wherein the portion of the transparent lid areas define a pattern uniquely identifying the electronic package, wherein the light is transmitted to the portion of the transparent lid areas via at least a portion of the optical paths, wherein the light is detectable outside of the electronic package,
      wherein the optical paths comprise light transmissible materials configured to modify one or more characteristics of the light transmitting through the optical paths, wherein a resultant modification of the one or more characteristics of the light transmitting through the optical paths is configured to uniquely identify the electronic package.

2. The electronic package of claim 1, wherein the light is configured as an identification signal that identifies one of the one or more integrated circuits.

3. The electronic package of claim 1, wherein the light is configured as a status signal that identifies one or more operational characteristics of the one or more integrated circuits.

4. The electronic package of claim 1, wherein the light is configured as a data signal.

5. The electronic package of claim 1, further comprising one or more light sensors disposed within the electronic package and electrically coupled to at least one of the one or more integrated circuits, wherein the one or more light sensors are configured to detect the light, wherein the light is transmitted to the one or more light sensors via one of the optical paths.

6. The electronic package of claim 5, wherein the light is emitted from an external light emitter, therein the light is configured as a data signal.

7. The electronic package of claim 6, wherein the light is transmitted to a light detector as the data signal via the at least the portion of the optical paths.

8. The electronic package of claim 1, wherein at least a portion of the thermal spreader comprises glass, quartz, sapphire, diamond, plastic, or silicone.

9. The electronic package of claim 1, wherein the one or more transparent spreader areas is optically coupled to at least one of the one or more light sources or one or more light sensors via at least one of direct contact, an air gap, dispensed silicone, clear plastic, or a solid transparent material.

10. A system comprising:
    an electronic package comprising:
       a package base couplable to a host substrate,
       a package lid mechanically coupled to the package base comprising one or more transparent lid areas, wherein the one or more transparent lid areas are configured to allow transmission of light through the package lid that defines a pattern configured to uniquely identify the electronic package,
       a thermal spreader bonded on a first side to a first side of the package lid, comprising one or more transparent spreader areas, wherein the one or more transparent spreader areas are configured to allow transmission of the light through the thermal spreader, one or more optical paths comprising at least one of the one or more transparent spreader areas;

one or more light sources disposed within the electronic package and electrically coupled to at least one of one or more integrated circuits, wherein the one or more light sources are configured to emit the light, wherein the light is transmitted via the one or more optical paths and through the package lid;

one or more light sensors disposed within the electronic package and electrically coupled to at least one of the one or more integrated circuits, wherein the one or more light sensors are configured to detect the light from at least one of the one or more light sources, wherein the one or more optical paths comprise light transmissible materials configured to modify one or more characteristics of the light transmitting through the one or more optical paths, wherein a resultant modification of the one or more characteristics of the light transmitting through the one or more optical paths is configured to uniquely identify the electronic package.

11. The electronic package of claim 10, wherein the light is configured as a data signal.

\* \* \* \* \*